United States Patent
Zhang et al.

(10) Patent No.: US 10,164,104 B2
(45) Date of Patent: Dec. 25, 2018

(54) METHOD TO FORM AIR-GAP SPACERS AND AIR-GAP SPACER-CONTAINING STRUCTURES

(71) Applicant: GLOBALFOUNDRIES INC., Grand Cayman (KY)

(72) Inventors: Xunyuan Zhang, Albany, NY (US); Ruilong Xie, Schenectady, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 168 days.

(21) Appl. No.: 15/343,590

(22) Filed: Nov. 4, 2016

(65) Prior Publication Data

US 2018/0130899 A1    May 10, 2018

(51) Int. Cl.
   *H01L 29/78*   (2006.01)
   *H01L 29/66*   (2006.01)
   *H01L 29/51*   (2006.01)

(52) U.S. Cl.
   CPC .......... *H01L 29/785* (2013.01); *H01L 29/518* (2013.01); *H01L 29/6656* (2013.01); *H01L 29/66553* (2013.01); *H01L 29/66795* (2013.01)

(58) Field of Classification Search
   CPC ............. H01L 29/785; H01L 29/518; H01L 29/66553; H01L 29/6656; H01L 29/66795
   See application file for complete search history.

(56) References Cited

U.S. PATENT DOCUMENTS

| | | | |
|---|---|---|---|
| 9,362,355 B1* | 6/2016 | Cheng | H01L 29/66742 |
| 9,608,065 B1* | 3/2017 | Bergendahl | H01L 27/0886 |
| 9,859,166 B1* | 1/2018 | Cheng | H01L 21/823487 |
| 2017/0141207 A1* | 5/2017 | Cheng | H01L 29/66742 |
| 2017/0250262 A1* | 8/2017 | Cheng | H01L 29/41791 |
| 2017/0330965 A1* | 11/2017 | Basker | H01L 29/42392 |
| 2018/0114848 A1* | 4/2018 | Xu | H01L 29/6681 |
| 2018/0122919 A1* | 5/2018 | Park | H01L 29/66545 |

* cited by examiner

*Primary Examiner* — Peter Bradford
(74) *Attorney, Agent, or Firm* — Scully Scott Murphy and Presser; Frank Digiglio (57) ABSTRACT

A device includes an air-gap (i.e., air-gap spacer) formed in situ during the selective, non-conformal deposition of a conductive material. The air-gap is disposed between source/drain contacts and a gate conductor of the device and beneath a portion of the conductive material, and is configured to decrease capacitive coupling between adjacent conductive elements. Prior to deposition of the conductive material, source/drain contact structures are recessed and a selective etch is used to remove sidewall spacers that are disposed between the source/drain contacts and the gate structures.

11 Claims, 9 Drawing Sheets

METHOD TO FORM AIR-GAP SPACERS AND AIR-GAP SPACER-CONTAINING STRUCTURES

BACKGROUND

The present application relates generally to methods for forming semiconductor devices, and more specifically to devices such as fin field effect transistors (FinFETs) having air-gap spacers disposed between adjacent conductive elements.

A trend in the development of semiconductor manufacturing technologies has been to increase the density of devices per chip, and hence decrease the size of active structures as well as the distances between such structures. An increase in device density may advantageously affect device performance such as circuit speed, and may allow also for increasingly complex designs and capabilities. However, the decrease in size and the attendant increase in density may also generate undesirable effects, including unwanted capacitive coupling between adjacent conductive elements.

In response to an applied voltage across a first conductor, for instance, the resulting electric field may induce unwanted charge segregation in an unbiased, neighboring conductor. Capacitive coupling may also occur between a gate conductor and a source/drain region, e.g., source/drain contacts, resulting in charge segregation near the source/drain region rather than in the channel region of a transistor.

SUMMARY

It is therefore desirable to develop semiconductor device architectures and methods for fabricating device architectures that have decreased capacitive coupling between adjacent conductive elements, such as between adjacent gate conductors or between a gate conductor and an adjacent source/drain region.

In various embodiments, an air-gap (i.e., air-gap spacer) is formed proximate to the sidewall surfaces of a gate conductor. The incorporation of the air-gap decreases the polarizability of adjacent structures when a voltage is applied across the gate conductor, thus decreasing the capacitive coupling and improving both performance and reliability of the device while facilitating an increased integration density.

Air-gaps are formed in situ during the non-conformal re-growth of conductive source/drain contacts. In various methods, source/drain contacts are formed over raised active regions and adjacent to conductive gate structures. The source/drain contacts are recessed and a selective etch is used to remove sidewall spacers that are disposed between the source/drain contacts and the gate structures. Then, upper portions of the source/drain contacts are reformed via selective, non-conformal deposition of a conductive material from exposed surfaces of the recessed source/drain contacts. An air-gap spacer is formed beneath a portion of the conductive material.

In accordance with several embodiments of the present application, a method of forming a fin field effect transistor (FinFET) device includes forming a fin over a semiconductor substrate. Source/drain junctions are formed over source and drain regions of the fin, and a gate stack is formed over a channel region of the fin between adjacent source/drain junctions. The method further includes forming an interlayer dielectric comprising a first dielectric material over the source/drain junctions, and forming spacers comprising a second dielectric material over sidewalls of the source/drain junctions and over sidewalls of the interlayer dielectric.

The gate stack is recessed to form an opening over the gate stack. A gate cap is deposited within the opening. Then, the interlayer dielectric is etched to expose the source/drain junctions. Conductive contacts are formed in electrical contact with the exposed portions of the source/drain junctions. The conductive contacts are recessed to expose the spacers, which are then removed. A conductive layer is selectively deposited over the recessed conductive contacts. Pinch-off of the conductive layer with the adjacent gate cap defines an air-gap between the conductive contact and the gate where the air-gap underlies a portion of the conductive layer.

A fin field effect transistor device includes a source/drain junction disposed over a source/drain region of a semiconductor fin and a conductive contact disposed over and in electrical contact with the source/drain junction. A gate stack is disposed over a channel region of the fin adjacent to the source/drain junction such that the gate stack has a sidewall surface that is laterally spaced from the conductive contact by an air-gap. A conductive layer disposed over and in electrical contact with the conductive contact defines a top surface of the air-gap.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Reference will now be made in greater detail to various embodiments of the subject matter of the present application, some embodiments of which are illustrated in the accompanying drawings. The same reference numerals will be used throughout the drawings to refer to the same or similar parts.

Disclosed in various embodiments is a device such as a transistor having an air-gap disposed between adjacent conductive elements such as between a gate electrode and a source/drain contact. Incorporation of the air-gap into the transistor architecture decreases the parasitic capacitance between adjacent conductive structures, especially between the gate electrode (e.g., gate conductor) and contact metallization. The air-gap is defined by the deposition and concomitant pinch off of a conductive material. Methods for forming transistor architectures having air-gap spacers and related structures are described herein with reference to FIGS. 1-9.

Figure 1:
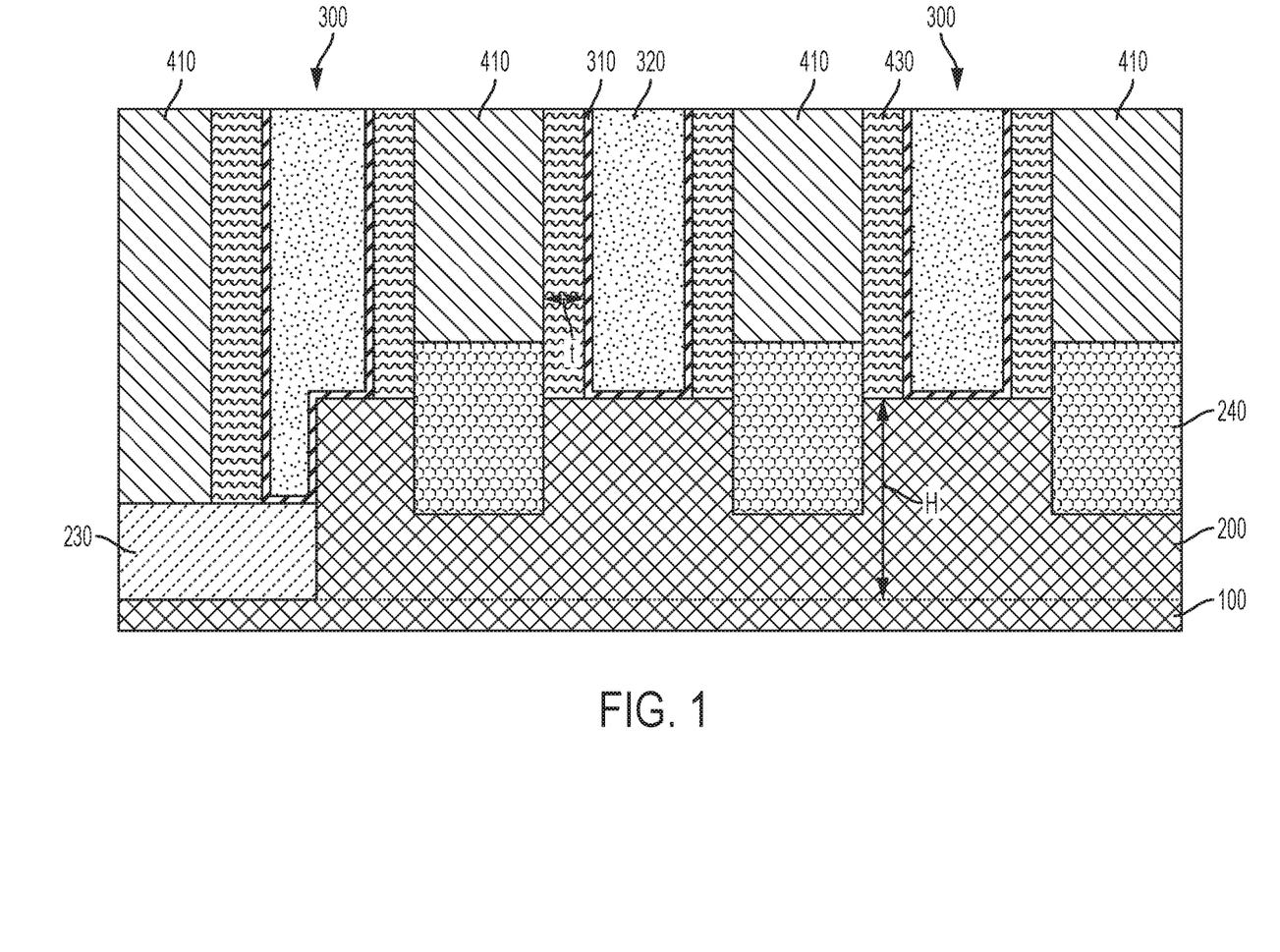
FIG. 1 is a schematic cross-sectional diagram of a planarized FinFET device at an intermediate stage of fabrication having raised active regions disposed over source/drain regions of a semiconductor fin and gate stacks disposed over channel regions of the fin.

Referring to FIG. 1, a semiconductor fin 200 is formed over a semiconductor substrate 100. Electrical isolation is provided by shallow trench isolation layer 230. The semiconductor substrate 100 may be a bulk substrate or a composite substrate such as a semiconductor-on-insulator (SOI) substrate.

Semiconductor substrate 100 may comprise a semiconductor material such as silicon or a silicon-containing material. Silicon-containing materials include, but are not limited to, single crystal Si, polycrystalline Si, single crystal silicon germanium (SiGe), polycrystalline silicon germanium, silicon doped with carbon (Si:C), amorphous Si, as well as combinations and multi-layers thereof. The substrate 100 is not limited to silicon-containing materials, however, as the substrate 100 may comprise other semiconductor materials, including Ge and compound semiconductors such as GaAs, InAs and other like semiconductors.

In various embodiments, fins 200 comprise a semiconductor material such as silicon, and may be formed by patterning and then etching. The patterning process may comprise photolithography, which includes forming a layer of photoresist material (not shown) atop a material or material stack to be patterned. The photoresist material may include a positive-tone photoresist composition, a negative-tone photoresist composition, or a hybrid-tone photoresist composition. A layer of photoresist material may be formed by a deposition process such as, for example, spin-on coating.

The deposited photoresist is then subjected to a pattern of irradiation, and the exposed photoresist material is developed utilizing a conventional resist developer. The pattern provided by the patterned photoresist material is thereafter transferred into the underlying material layer or material layers utilizing at least one pattern transfer etching process. Such an underlying layer may be the semiconductor layer of an SOI substrate or a top portion of a bulk semiconductor substrate.

The pattern transfer etching process is typically an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

In still further embodiments, the patterning process may include a sidewall image transfer (SIT) process, which includes formation of a spacer material on sidewall surfaces of a mandrel structure; the spacer includes a material that has a different etch selectivity than the mandrel structure. After spacer formation, the mandrel structure is removed by etching, and then each spacer material is used as a hard mask during a subsequent etching process that defines the fin(s).

As used herein, a "fin" refers to a contiguous semiconductor material that includes a pair of vertical sidewalls that are parallel to each other. As used herein, a surface is "vertical" if there exists a vertical plane from which the surface does not deviate by more than three times the root mean square roughness of the surface. Each of a plurality of fins 200 can comprise a single crystal semiconductor material that extends along a lengthwise direction (L). As used herein, a "lengthwise direction" is a horizontal direction along with an object extends the most. A "widthwise direction" (W) is a horizontal direction that is perpendicular to the lengthwise direction.

The fins 200 are formed from any suitable semiconductor material and may comprise, for example, single crystal Si, single crystal germanium, single crystal silicon germanium (SiGe), and the like. As used herein, the term "single crystal" denotes a crystalline solid in which the crystal lattice of the entire solid is substantially continuous and substantially unbroken to the edges of the solid with substantially no grain boundaries.

The semiconductor material forming fins 200 may be doped, un-doped, or contain doped and un-doped regions therein. Each doped region within the semiconductor fins 200 may have the same or different doping concentrations and/or conductivities. Doped regions that are present can be formed, for example, by ion implantation, gas phase doping, diffusion from epitaxy, or by dopants that are present in the material used to form the fins. For instance, fins 200 may be formed from the semiconductor layer of an SOI substrate, which may comprise a dopant prior to forming the fins 200. By way of example, fins 200 may be uniformly doped and have a dopant concentration in the range of $1 \times 10^{15}$ atoms/$cm^3$ to $1 \times 10^{18}$ atoms/$cm^3$.

In various embodiments, the as-formed fins 200 are free-standing, i.e., supported only by the substrate 100. Each fin has a height (H) that may range from 10 nm to 100 nm and a width (W) that may range from 4 nm to 30 nm. Other heights and widths that are less than or greater than the ranges mentioned can also be used. The fins 200 may have an aspect ratio (H/W) ranging from 1 to 5, e.g., 1, 1.5, 2, 3, 4 or 5, including ranges between any of the foregoing values.

In structures comprising plural fins, i.e., a fin array, each fin may be spaced apart from its nearest neighbor by a periodicity or pitch (d) of 20 nm to 100 nm, e.g., 20, 30, 40, 50, 60, 70, 80, 90 or 100 nm, including ranges between any of the foregoing values. Such plural fins are typically oriented parallel to each other and perpendicular to the library logic flow of a circuit.

In various embodiments, each of a plurality of semiconductor fins 200 extends along a lengthwise direction with a substantially rectangular vertical cross-sectional shape. As used herein, a "substantially rectangular shape" is a shape that differs from a rectangular shape only due to atomic level roughness that does not exceed 2 nm. The substantially rectangular vertical cross-sectional shape is a shape within a plane including a vertical direction and a widthwise direction.

Plural fins may have identical or substantially identical dimensions, i.e., height and/or width. As used herein, substantially identical dimensions vary by less than 10%, e.g., less than 5%, 2% or 1%.

Referring still to FIG. 1, raised active regions 240 are formed over source/drain regions of the fins 200. The terminals of a field effect transistor are commonly referred to as source, gate and drain. In the FET, a small amount of voltage is applied to the gate in order to control current flowing between the source and drain. As used herein, a "raised active region" refers to a doped semiconductor material portion that protrudes above a topmost surface of an active region of a semiconductor device. An "active region" refers to a semiconductor material portion within a semiconductor device through which charge carriers flow during operation of the device. A "raised region" refers to a material portion that protrudes above a planar surface. The plurality of the raised active regions 240, i.e., source/drain junctions, include raised source regions that are formed on a source side of the fins with respect to the gate 300, and raised drain regions that are formed on a drain side of the fins with respect to the gate 300.

According to various embodiments, raised active regions 240 are formed by selective epitaxy, and may comprise silicon (e.g., Si) or a silicon-containing material such as silicon germanium (SiGe). In various embodiments, the topmost surface of the fins 200 have a (100) orientation while the sidewalls of the fins present a (110) orientation. Epitaxial growth on the fins thus naturally forms into faceted, diamond-shaped structures. The faceted shape results from the different relative growth rates over different crystallographic orientations. The growth rate on silicon (Si) surfaces having (100) orientations is faster than that on other planes such as (110) and the growth rate on silicon surfaces having (111) orientations is slower than that on other planes such as (110) or (100) planes. Accordingly, the diamond-shaped structures formed on fins 200, which is shown schematically in the transverse views of FIGS. 4B-9B, result from the slowest epitaxial growth rate on the (111) surface.

The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a (100) crystal surface will take on a (100) orientation. Example epitaxial growth processes include low energy plasma deposition, liquid phase epitaxy, molecular beam epitaxy, and atmospheric pressure chemical vapor deposition.

The epitaxial source and drain regions 240 may be doped, which may be performed in situ, i.e., during epitaxial growth, or following epitaxial growth, for example, using ion implantation. Doping changes the electron and hole carrier concentrations of an intrinsic semiconductor at thermal equilibrium. A doped layer or region may be p-type or n-type.

As used herein, "p-type" refers to the addition of impurities to an intrinsic semiconductor that creates a deficiency of valence electrons. In a silicon-containing fin or raised active region, example p-type dopants, i.e., impurities, include but are not limited to boron, aluminum, gallium, and indium. As used herein, "n-type" refers to the addition of impurities that contribute free electrons to an intrinsic semiconductor. In a silicon-containing fin or raised active region, example n-type dopants, i.e., impurities, include but are not limited to, antimony, arsenic, and phosphorus.

For instance, if a plurality of semiconductor fins are doped with dopants of a first conductivity type, the plurality of raised active regions can be doped with dopants of a second conductivity type, which is the opposite of the first conductivity type. If the first conductivity type is p-type, the second conductivity type is n-type, and vice versa. By way of example, a dopant region is implanted with arsenic or phosphorus to form an n-type region. In another example, a dopant region is implanted with boron to form a p-type region. The dopant concentration within the raised source and drain regions 240 may range from $1\times10^{19}$ atoms/cm$^3$ to $1\times10^{22}$ atoms/cm$^3$, e.g., $1\times10^{20}$ atoms/cm$^3$ to $1\times10^{21}$ atoms/cm$^3$.

An optional drive-in anneal can be used to diffuse dopant species and generate a desired dopant profile. In certain embodiments, dopant atoms within the source and drain raised active regions 240 may be diffused into the semiconductor fins 200 using a post-epitaxy anneal (e.g., at a temperature of 600° C. to 1400° C.) to create a desired dopant profile within the fins proximate to the source and drain regions.

A dielectric layer 410 is disposed over the raised active regions 240. The dielectric layer 410 may comprise any dielectric material including, for example, oxides, nitrides or oxynitrides. In one embodiment, the dielectric layer 410 includes silicon dioxide. The dielectric layer 410 may be formed, for example, by CVD or spin-coating. In various embodiments, the dielectric layer may be self-planarizing, or the top surface of the dielectric layer 410 can be planarized by chemical mechanical polishing (CMP). In certain embodiments, a sidewall of the dielectric layer 410 is co-planar with a sidewall of the underlying raised active region 240.

A sacrificial spacer 430 is disposed over sidewalls (vertical surfaces) of the dielectric layer 410 and raised active regions 240. Sacrificial spacer 430 may be formed by blanket deposition of a spacer material followed by a directional etch such as reactive ion etching (RIE) to remove the spacer material from horizontal surfaces. In certain embodiments, the sacrificial spacer 430 thickness (t) is 4 to 20 nm, e.g., 4, 10, 15 or 20 nm, including ranges between any of the foregoing values.

Suitable spacer materials include oxides, nitrides and oxynitrides, such as silicon dioxide, silicon nitride, silicon oxynitride, and low dielectric constant (low-k) materials such as amorphous carbon, SiOC, SiOCN and SiBCN, as well as a low-k dielectric material. As used herein, a low-k material has a dielectric constant less than that of silicon dioxide.

Exemplary low-k materials include but are not limited to, amorphous carbon, fluorine-doped oxides, or carbon-doped oxides. Commercially-available low-k dielectric products and materials include Dow Corning's SiLK™ and porous SiLK™, Applied Materials' Black Diamond™, Texas Instrument's Coral™ and TSMC's Black Diamond™ and Coral™.

The sacrificial spacer 430 may be deposited by plasma enhanced chemical vapor deposition (PECVD). The sacrificial spacers 430 may include a layer of silicon dioxide formed directly over the dielectric layer 410 and the raised active region 240, and a layer of silicon nitride formed directly over the layer of silicon dioxide. Buffering of silicon nitride with silicon dioxide facilitates later removal of the sacrificial spacers 430.

A gate 300 is formed over the tops and sidewalls of the fins 200, i.e., over channel regions of the fins, as well as over portions of the sidewall spacers 430. Gate 300 includes a conformal gate dielectric 310 and a gate conductor 320 disposed over the gate dielectric 310.

The gate dielectric 310 may include silicon dioxide, silicon nitride, silicon oxynitride, a high-k dielectric, or other suitable material. As used herein, a high-k material has a dielectric constant greater than that of silicon dioxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2.

The gate dielectric 310 may be deposited by a suitable process such as atomic layer deposition (ALD), chemical vapor deposition (CVD), physical vapor deposition (PVD), thermal oxidation, UV-ozone oxidation, or combinations thereof. The gate dielectric thickness may range from 1 nm to 10 nm, e.g., 1, 2, 4, 6, 8 or 10 nm, including ranges between any of the foregoing.

The gate conductor 320 may include a conductive material such as polysilicon, silicon-germanium, a conductive metal such as Al, W, Cu, Ti, Ta, W, Co, Pt, Ag, Au, Ru, Ir, Rh and Re, alloys of conductive metals, e.g., Al—Cu, silicides of a conductive metal, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The gate conductor 320 may comprise one or more layers of such materials such as, for example, a metal stack including a work function metal layer and/or a liner.

The gate conductor 320 can be formed utilizing a conventional deposition process such as, for example, ALD, CVD, metalorganic chemical vapor deposition (MOCVD), molecular beam epitaxy (MBE), PVD, sputtering, plating, evaporation, ion beam deposition, electron beam deposition, laser assisted deposition, or chemical solution deposition.

FIG. 1 shows an intermediate device architecture after patterning and planarization of gates 300 over channel regions of the fin 200. "Planarization" is a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

Figure 2:
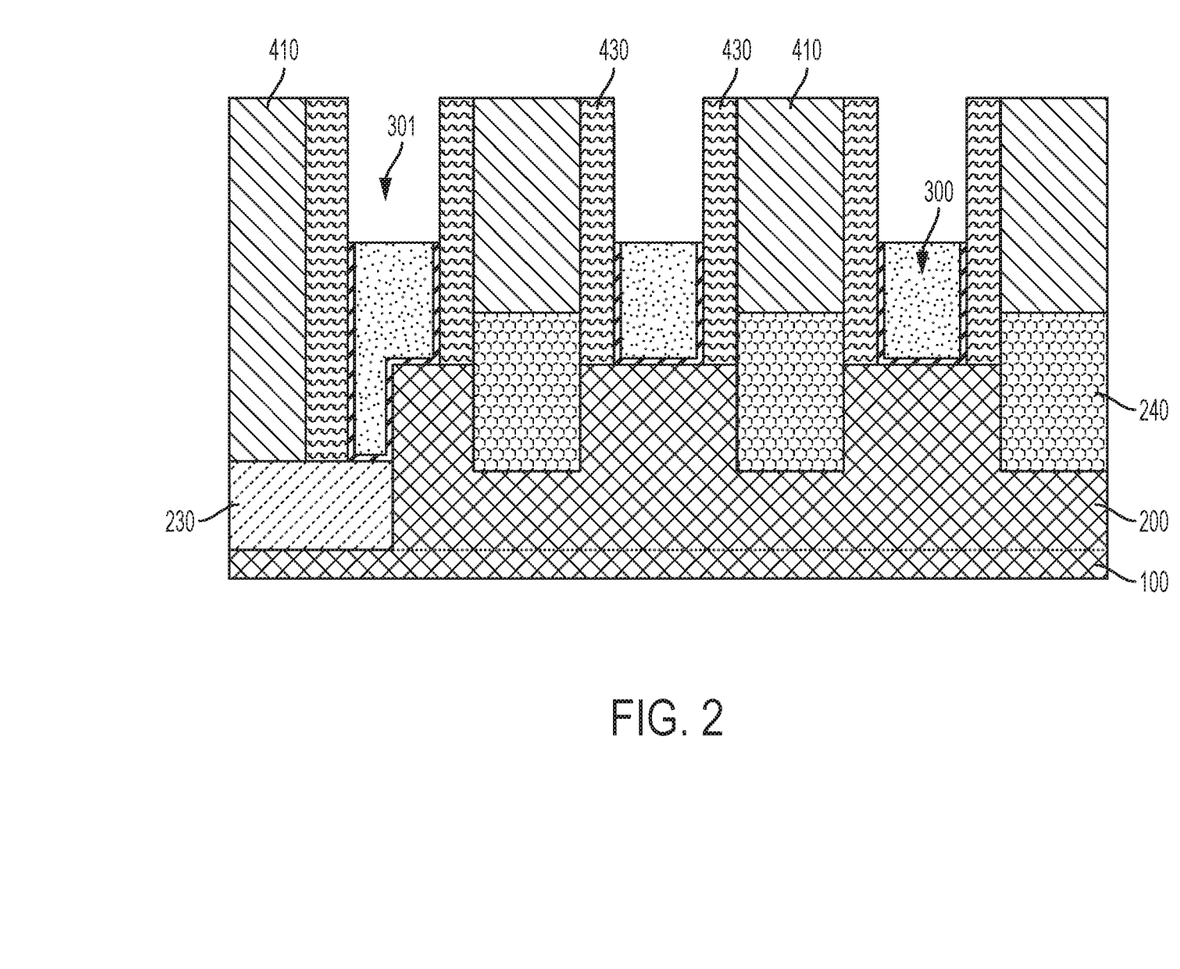
FIG. 2 shows the structure of FIG. 1 following a recess etch of the gate stacks.

Referring to FIG. 2, gates 300 are recessed using a selective etch to form openings 301. One or more reactive ion etch steps can be used to etch the gate materials. In certain embodiments, 25% to 75% of the original gate height is removed by the recess etch. The recess etch exposes sidewalls of the sidewall spacers 430 above remaining portions of the gates 300.

Figure 3:
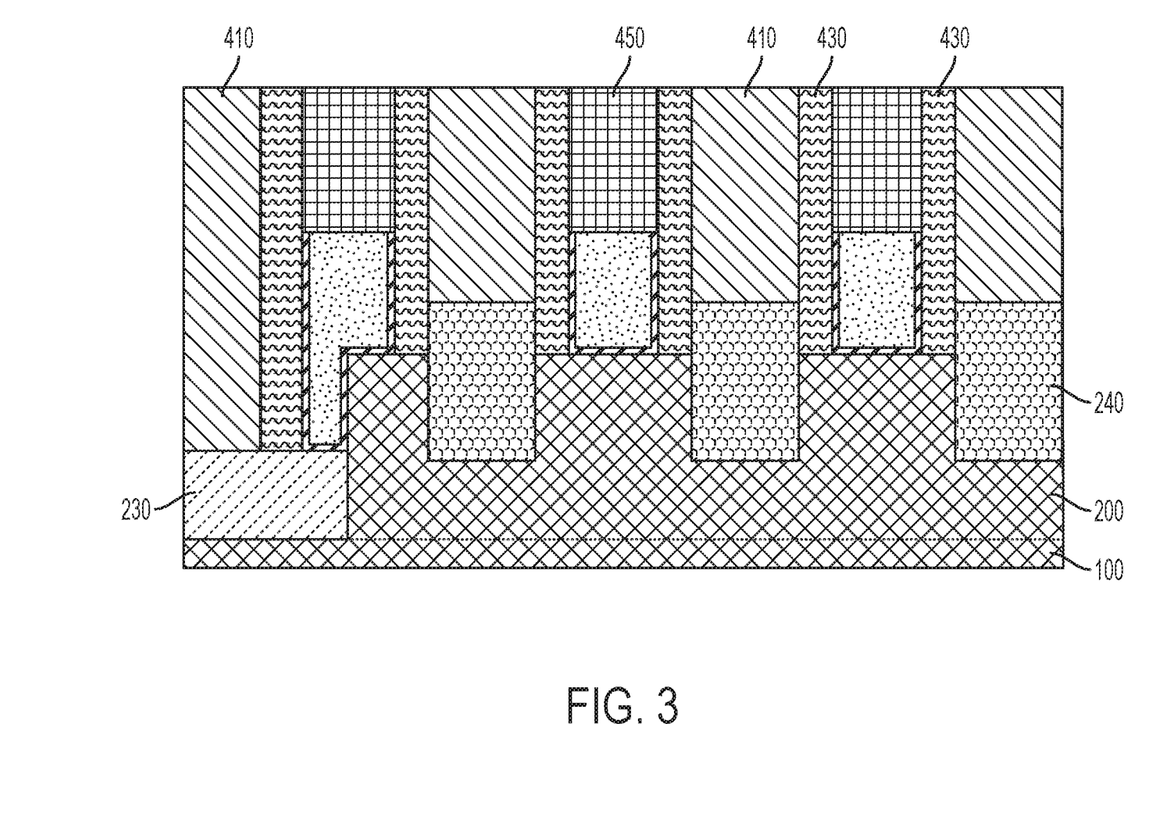
FIG. 3 depicts the formation of a dielectric cap over the recessed gates.

Referring to FIG. 3, the openings 301 formed by removing a portion of each gate 300 are then backfilled with a self-aligned gate cap 450. Gate cap 450 may be formed using the materials and processes used to form the sidewall spacers 430. In various embodiments, the gate cap 450 comprises a first dielectric material while the sidewall spacers 430 comprise a second dielectric material different than the first dielectric material. Using different dielectric materials for the gate cap 450 and the sidewall spacers 430 enables selective etching of the sidewall spacers 430 with respect to the gate caps 450 during subsequent processing.

In certain embodiments, gate cap 450 comprises SiOC while sidewall spacers 430 comprise silicon nitride. Following deposition of the gate cap 450, a planarization process may be used to remove the overburden and, as shown in FIG. 3, form a planarized structure.

Figures 4A, 4B:
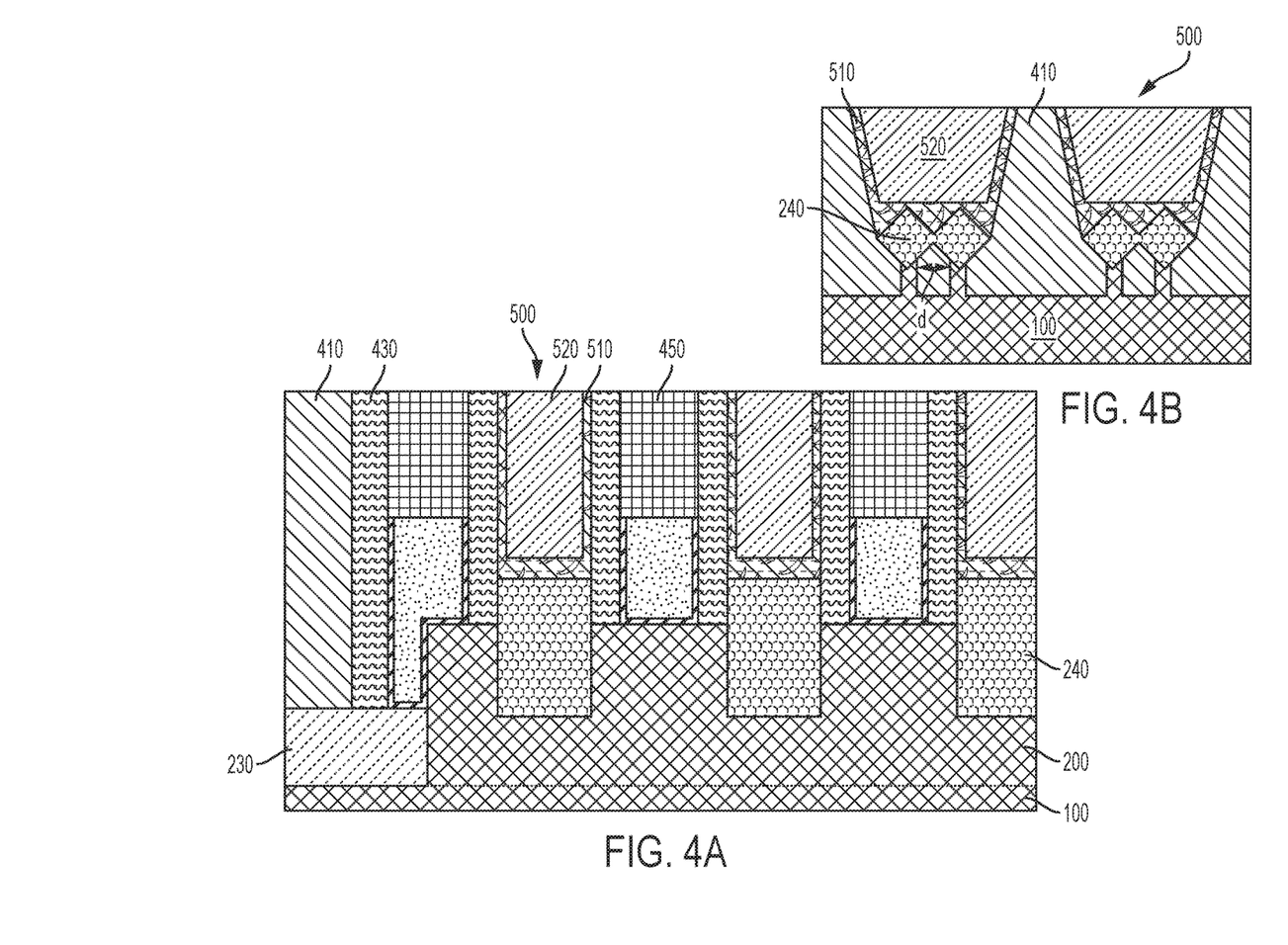
FIG. 4A shows the removal of an interlayer dielectric from over the raised active regions and the formation of source/drain contacts.
FIG. 4B is a transverse view of the structure of FIG. 4A.

Next, contact openings are created by removing the dielectric layer 410 from over the raised active regions 240. Referring to FIG. 4A, a conductive contact 500 is formed within the contact openings and over exposed surfaces of the raised active regions 240 by depositing a barrier layer 510, typically titanium nitride (TiN), and then filling the contact openings with a contact layer 520 such as tungsten or cobalt, for example. Conductive contacts can be formed using CVD or ALD. A silicide (not shown) may be formed between the contact layer 520 and the raised active regions 240.

After formation of the conductive contacts 500, a planarization process may be used to form a planarized structure. FIG. 4B is a transverse view showing conductive contacts 500 in electrical contact with raised active regions 240.

Figures 5A, 5B:
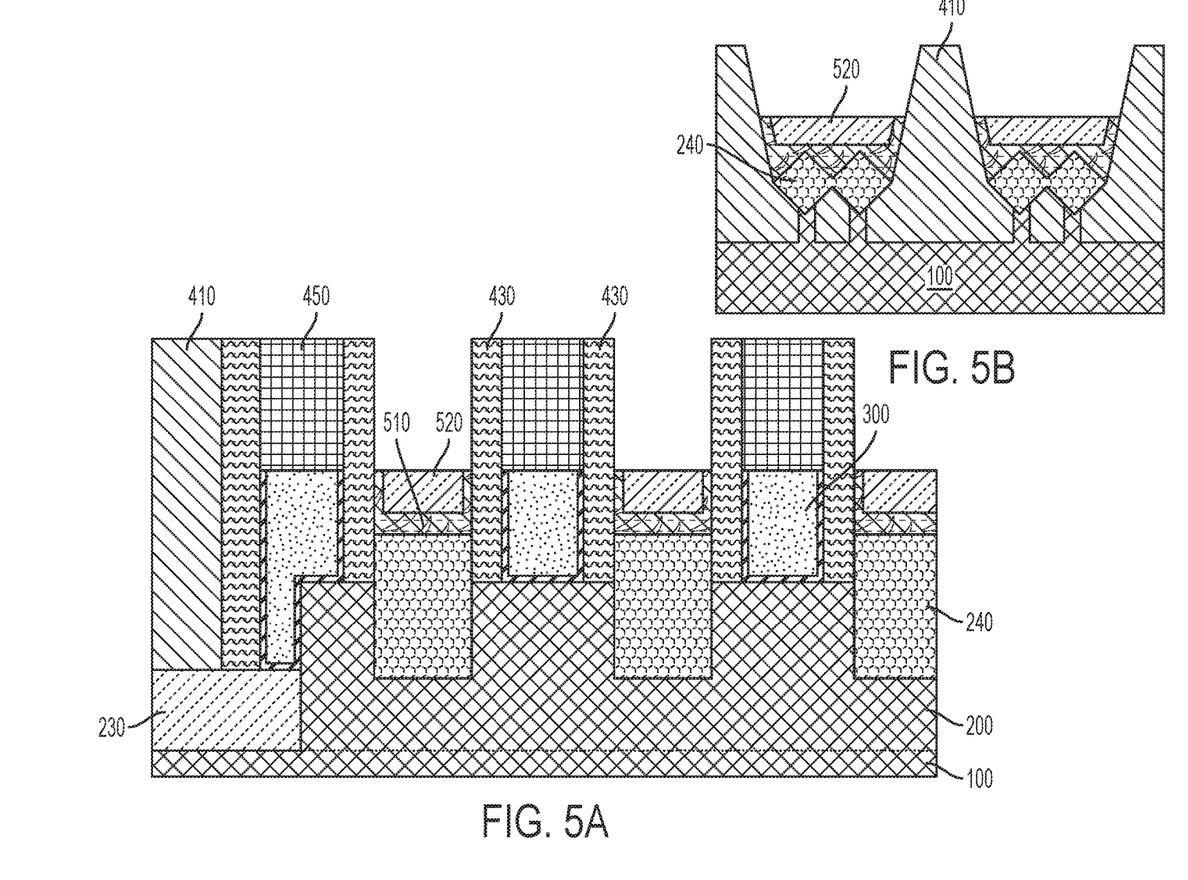
FIG. 5A shows the structure of FIG. 4A following a recess etch of the source/drain contacts.
FIG. 5B is a transverse view of the structure of FIG. 5A.

FIG. 5A shows the structure of FIG. 4A following a recess etch of the source/drain conductive contacts 500. One or more reactive ion etch (RIE) step may be used to etch the contact layer 520 and the barrier layer 510, i.e., in succession. A top surface of the contact structure 500 includes an exposed portion of contact layer 520. In certain embodiments, the recessed top surface of the contact structure 500 can be at or above a top surface of an adjacent gate 300. FIG. 5B is a transverse view of the structure of FIG. 5A showing adjacent conductive contacts 500 recessed with respect to dielectric layer 410.

Figures 6A, 6B:
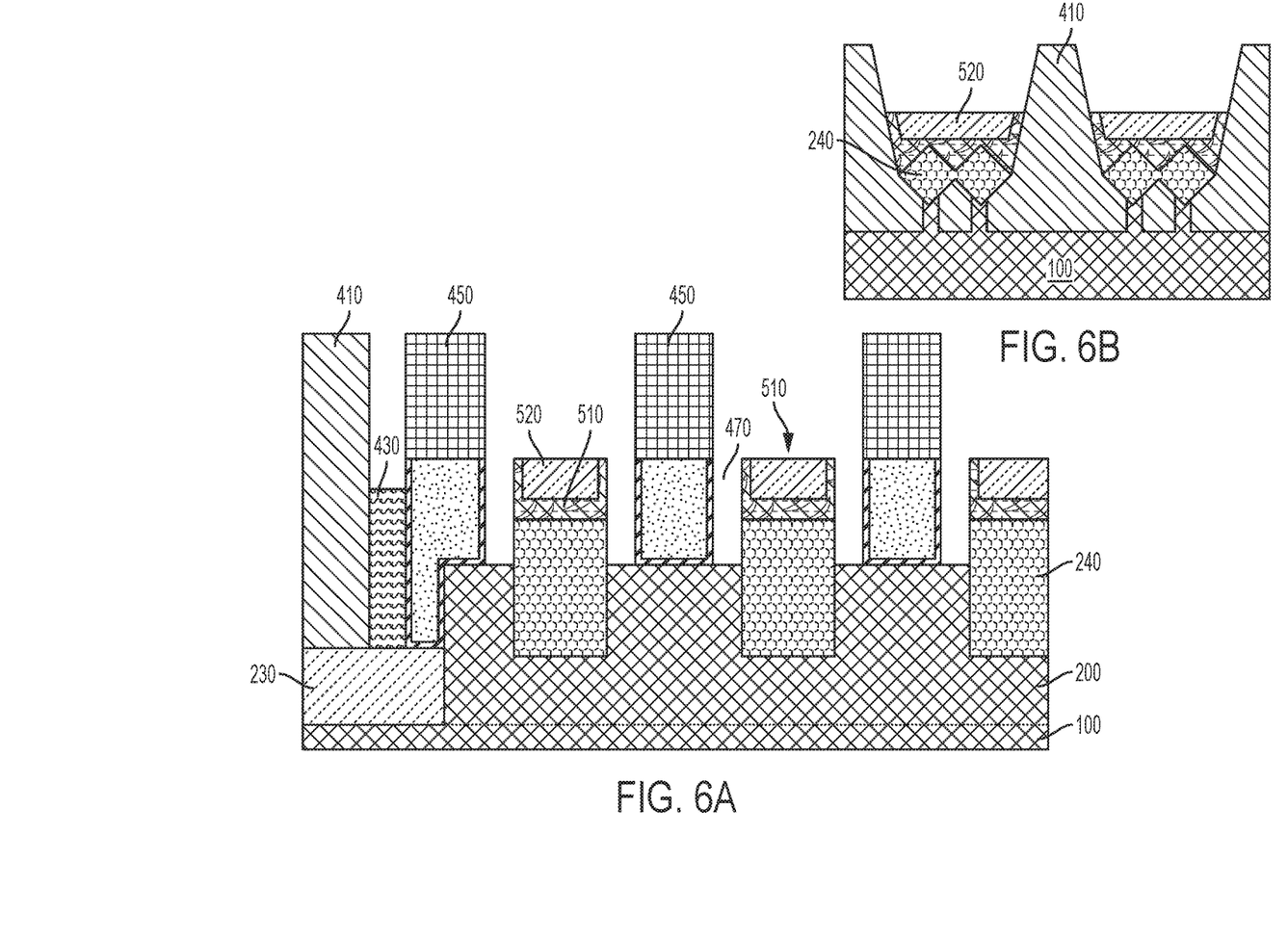
FIG. 6A shows the selective removal of sidewall spacers from between the source/drain contacts and the gate stacks.
FIG. 6B is a transverse view of the structure of FIG. 6A.

Following the recess etch of the conductive contacts 500, FIG. 6A shows the selective removal (e.g., complete removal) of the sacrificial spacers 440 from between the source/drain conductive contacts 500 and an adjacent gate 300. For instance, the sidewall spacers can comprise silicon nitride, which can be etched selectively to the dielectric layer 410, which can comprise silicon dioxide, the gate cap 450, which can comprise SiOC, as well as the gate materials. Removal of the spacers 440 defines a cavity 470 that extends between the gate 300 and the laterally adjacent source/drain conductive contacts 500. In various embodiments, a horizontal distance (t) from the gate 300 to the source/drain conductive contact 500 may range from 4 to 20 nm, e.g., 4, 10, 15 or 20 nm, including ranges between any of the foregoing values. FIG. 6B is a transverse view of the structure of FIG. 6A.

Referring back to FIG. 5A, the prior recess etch of the conductive contact 500 exposes a surface of each of the sidewall spacers 430 proximate to the conductive contact, such that only a portion of each sidewall spacer 430 remains bounded by both the conductive contact 500 and the gate 300. Exposure of the sidewall spacers 430 facilitates etching and removal thereof, including the portion of the sacrificial sidewall spacers disposed between the source/drain conductive contacts 500 and the gate 300 and between the raised active region 240 and the gate 300. In certain embodiments, the aspect ratio of the portion of the sidewall spacer 430 remaining between the conductive contact 500 and the gate 300 may range from 3:1 to 6:1, e.g., 3:1, 4:1, 5:1 or 6:1, including ranges between any of the foregoing values. Furthermore, by recessing the source/drain conductive contacts 500 prior to etching the sidewall spacer 430, etch damage to the conductive contacts 500 during the sidewall spacer etch can be minimized because the etch time to remove the sidewall spacer is less than if the source/drain conductive contacts were not recessed.

Figures 7A, 7B:
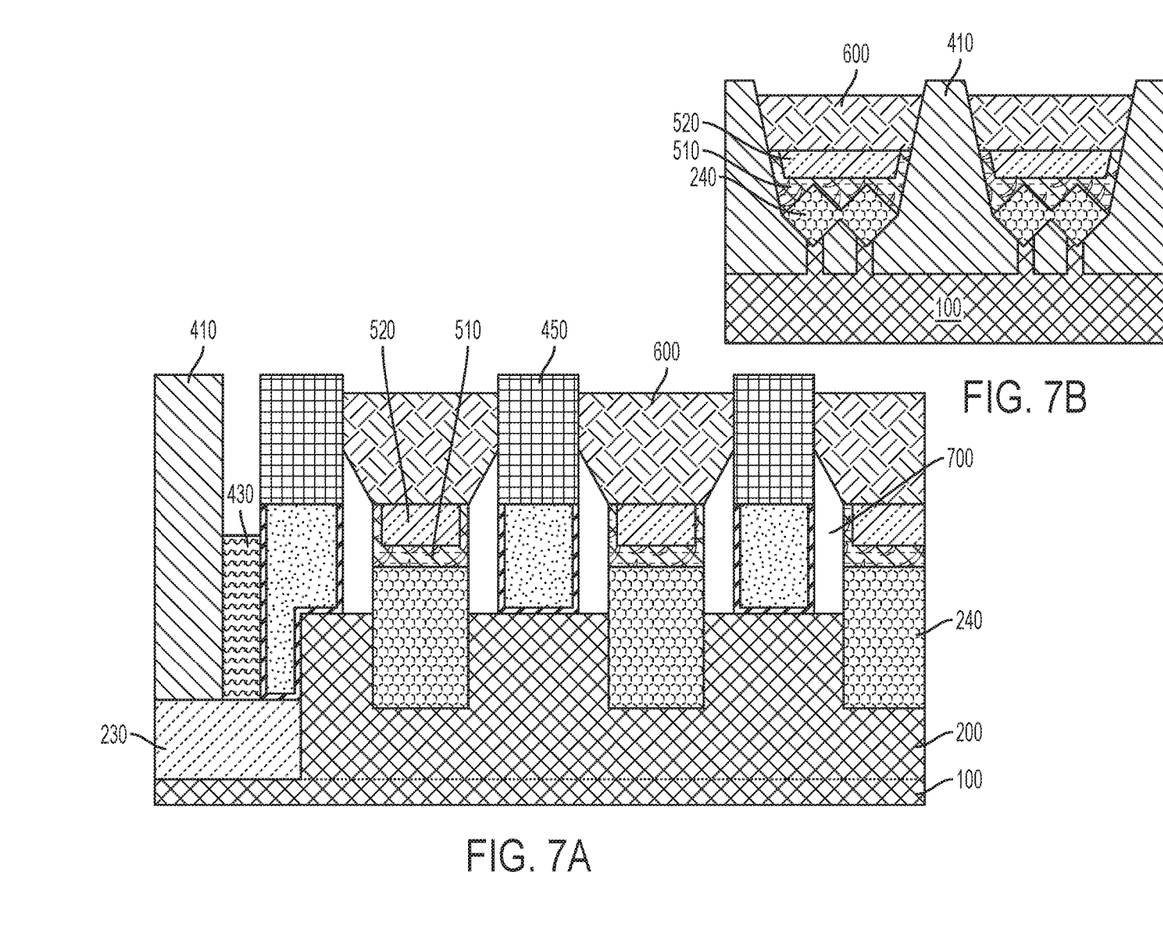
FIG. 7A shows the selective, non-conformal deposition of a conductive layer over exposed surfaces of the recessed source/drain contacts after removal of the sidewall spacers to form air-gaps between the source/drain contacts and the gate stacks.
FIG. 7B is a transverse view of the structure of FIG. 7A.

FIG. 7A shows the architecture of FIG. 6A after selective, non-conformal deposition of a conductive material (e.g., tungsten or cobalt) onto exposed surfaces of the remaining portion of the contact layer 520 to form a conductive layer 600 over and in electrical contact with contact layer 520. In various embodiments, growth of the conductive layer 600 proceeds only from contact layer 520. Due to a pinch-off phenomenon associated with the non-conformal deposition of the conductive material, the conductive layer 600 will impinge upon sidewalls of gate cap 450 resulting in the formation of air-gaps 700 between the gate 300 and the conductive contact 500 beneath the conductive layer 600. A top surface of the air-gaps 700 comprises the conductive material of conductive layer 600.

In various embodiments, conductive layer 600 can be formed using electroless deposition, CVD or ALD, which provide selectivity with respect to the fin 200, raised active regions 240, gate dielectric 310 and gate cap 450. In contrast to electroplating, an electroless deposition process uses only one electrode and no external source of electric current. FIG. 7B is a transverse view of the structure of FIG. 7A showing conductive layer 600 in electrical contact with contact layer 520.

In various embodiments, the height of the air-gaps 700 is greater than the height of the gate 300. In various embodiments, the air-gaps completely occupy a lateral space between the gate 300 and both the conductive contact 500 and the raised active regions 240.

Air-gaps 700 may comprise air or other gases, including gases present during deposition of the dielectric material, such as oxygen, nitrogen, argon, hydrogen, helium, xenon, as well as mixtures thereof. The gas pressure within the air-gaps 700 may be atmospheric pressure. Alternatively, the gas pressure within the air-gaps 700 may be greater than or less than atmospheric pressure.

An exemplary method of forming a fin field effect transistor (FinFET) device comprises forming source/drain junctions over source and drain regions of a semiconductor fin and forming a conductive contact over each of the source/drain junctions. A gate stack is formed over a channel region of the fin between the source/drain junctions, where the gate stack is separated from the source/drain junctions by a spacer. The conductive contacts are recessed to expose the spacers. The spacers are then removed from between the source/drain junctions and the gate stack. A conductive layer is selectively deposited over each of the conductive contacts to form air-gaps between the gate stack and the recessed conductive contacts and beneath a portion of the conductive layer.

Figures 8A, 8B:
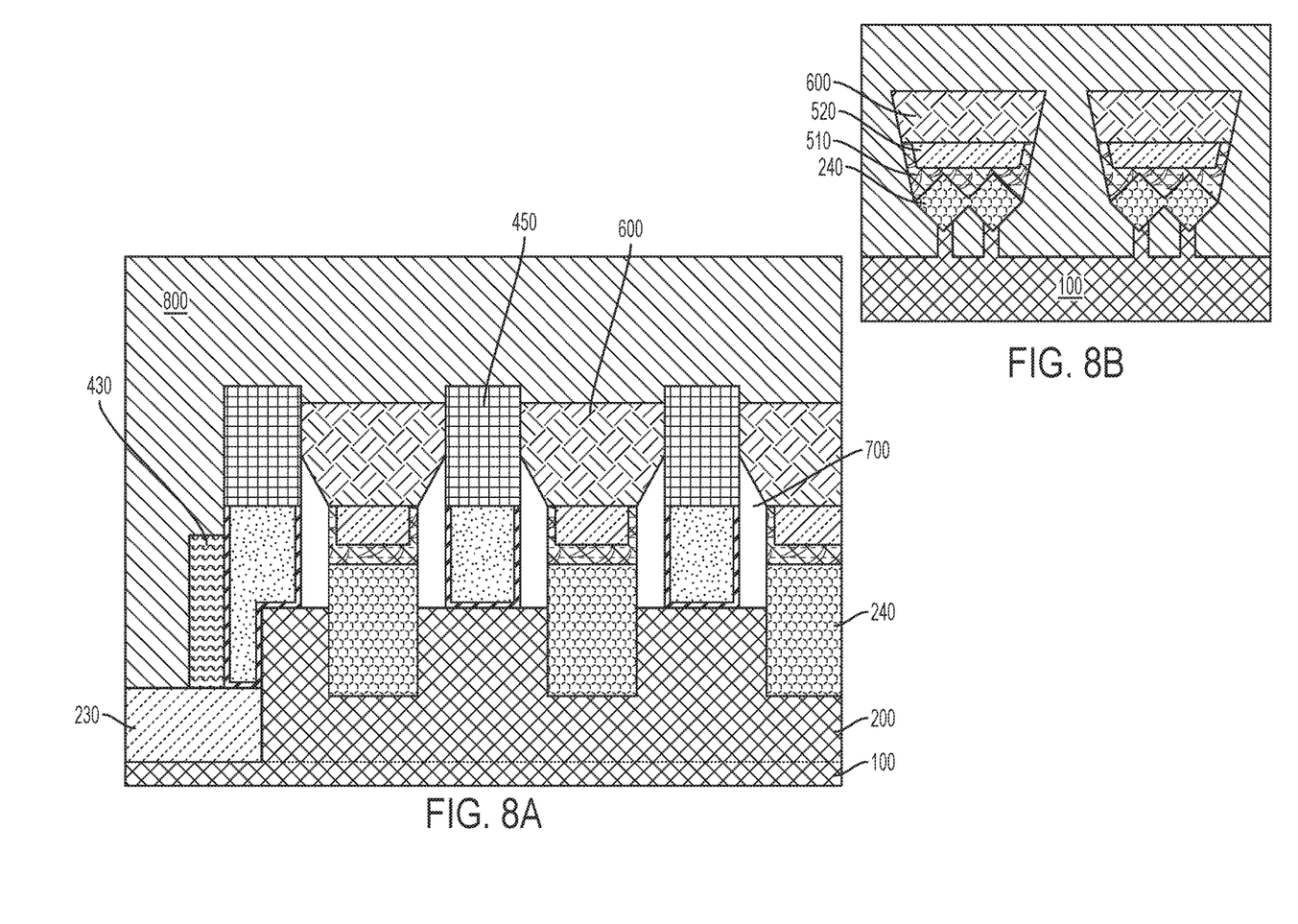
FIG. 8A depicts the formation of an interlayer dielectric over the structure of FIG. 7A.
FIG. 8B is a transverse view of the structure of FIG. 8A.

FIG. 8A shows an interlayer dielectric 800 formed over the structure of FIG. 7A. Interlayer dielectric 800 may comprise silicon oxide, for example, and may be formed by CVD or spin-coating and then planarized. FIG. 8B is a transverse view of the structure of FIG. 8A.

Figures 9A, 9B:
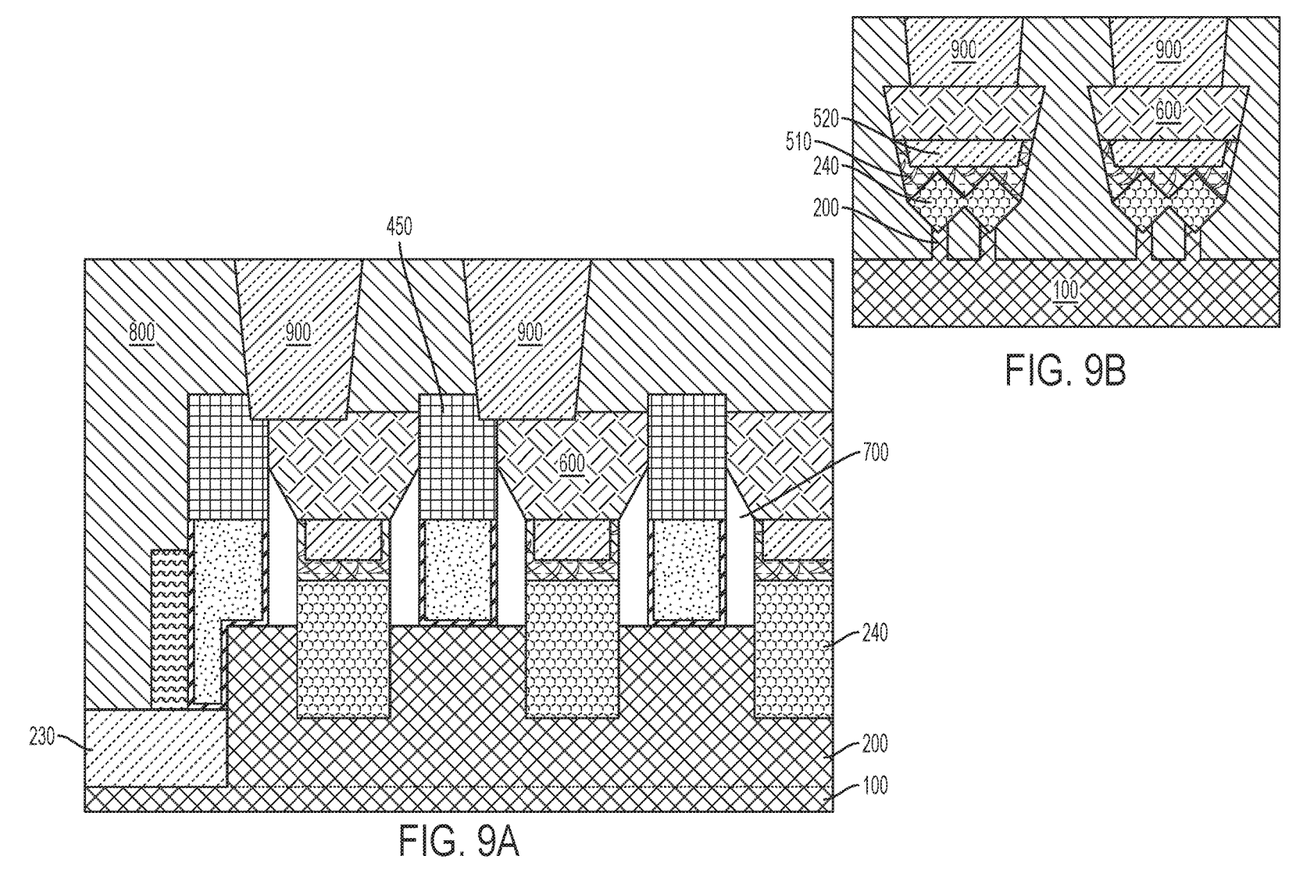
FIG. 9A shows the formation of contacts through the interlayer dielectric to the re-grown source/drain contacts.
FIG. 9B is a transverse view of the structure of FIG. 9A.

FIG. 9A shows the formation of contact structures 900 through the interlayer dielectric 800 to the re-grown source/drain contacts, i.e., conductive layer 600. Contact structures 900 may be formed directly on an exposed portion of the conductive layer 600 using a metallization process after etching vias in the interlayer dielectric 800. For instance, the contact structures 900 may be formed by a directional deposition method such as evaporation or collimated physical vapor deposition. Contact structures 900 may also contact gate caps 450, but do not contact the gates 300. Contact structures 900 may include a metal that forms an ohmic contact with the conductive layer 600. Exemplary metals for the contact structures include Al, Cu, Ti/Au, Pt/Ni, Au/Ge/Ni, for example. Following formation of the contact structures 900, a planarization process may be used to form a planarized structure where, for example, a top surface of the contact structures is co-planar with a top surface of the interlayer dielectric 800.

Air-gap spacers are formed by the selective, non-conformal deposition of a conductive material. A layer of the conductive material grows from an exposed surface of a previously-recessed source/drain conductive contact and impinges on the sidewalls of an adjacent gate cap. Pinch-off of the layer of conductive material defines an air-gap disposed beneath the layer of conductive material and between the source/drain conductive contact and an adjacent gate.

The incorporation of air-gap spacers laterally adjacent transistor gate conductors can decrease capacitive coupling between adjacent gate conductors and/or between gate conductors and adjacent source/drain regions. Integrated circuits having the disclosed structures may have improved reliability and decreased instances of circuit failure. Additionally, decreasing capacitive coupling by the addition of air-gap spacers may provide for increased integration density of transistors within an integrated circuit.

As used herein, the singular forms "a," "an" and "the" include plural referents unless the context clearly dictates otherwise. Thus, for example, reference to an "air-gap" includes examples having two or more such "air-gaps" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a spacer that comprises silicon nitride include embodiments where a spacer consists essentially of silicon nitride and embodiments where a spacer consists of silicon nitride.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:
1. A method of forming a fin field effect transistor (FinFET) device, comprising:

forming a source/drain junction over each of a source region and a drain region of a semiconductor fin;
forming a conductive contact over each of the source/drain junctions;
forming a gate stack over a channel region of the fin between the source/drain junctions, wherein the gate stack is separated from the source/drain junctions by spacers;
recessing the conductive contacts to expose the spacers;
removing the spacers from between the source/drain junctions and the gate stack; and
selectively depositing a conductive layer over each of the conductive contacts to form air-gaps between the gate stack and the recessed conductive contacts and beneath a portion of the conductive layer.

2. The method of claim 1, wherein the source/drain junctions are formed by selective epitaxy directly on the source and drain regions of the fin.

3. The method of claim 1, wherein the gate stack is formed over sidewalls of the spacers.

4. The method of claim 1, further comprising forming a gate cap over the gate stack.

5. The method of claim 4, wherein conductive layer impinges a sidewall of the gate cap.

6. The method of claim 1, wherein a top surface of the recessed conductive contact is at or above a top surface of the gate stack.

7. The method of claim 1, wherein the conductive layer is deposited by electroless deposition.

8. The method of claim 1, wherein the conductive layer forms a top surface of the air-gaps.

9. A method of forming a fin field effect transistor (FinFET) device, comprising:
forming a fin over a semiconductor substrate;
forming a source/drain junction over each of a source region and a drain region of the fin;
forming an interlayer dielectric comprising a first dielectric material over the source/drain junctions;
forming spacers comprising a second dielectric material over sidewalls of the source/drain junctions and over sidewalls of the interlayer dielectric;
forming a gate stack over a channel region of the fin and over sidewalls of the spacers between adjacent source/drain junctions;
recessing the gate stack to form an opening over the gate stack and depositing a gate cap within the opening;
etching the interlayer dielectric to expose the source/drain junctions;
forming conductive contacts in electrical contact with the exposed portions of the source/drain junctions;
recessing the conductive contacts to expose the spacers;
removing the spacers; and
selectively depositing a conductive layer over the recessed conductive contacts to form an air-gap between the recessed conductive contact and the gate stack and beneath a portion of the conductive layer.

10. The method of claim 9, wherein sidewalls of the interlayer dielectric are aligned with sidewalls of the source/drain junctions.

11. The method of claim 9, wherein the spacers are removed selective to the gate cap.

* * * * *